(12) United States Patent
Jones

(10) Patent No.: US 9,099,933 B2
(45) Date of Patent: Aug. 4, 2015

(54) AC-TO-AC CONVERTER AND METHOD FOR CONVERTING A FIRST FREQUENCY AC-VOLTAGE TO A SECOND FREQUENCY AC-VOLTAGE

(75) Inventor: Rodney Jones, Stoke on Trent (GB)

(73) Assignee: SIEMENS AKTIENGESELLSCHAFT, München (DE)

( * ) Notice: Subject to any disclaimer, the term of this patent is extended or adjusted under 35 U.S.C. 154(b) by 325 days.

(21) Appl. No.: 13/300,734

(22) Filed: Nov. 21, 2011

(65) Prior Publication Data

US 2012/0147633 A1    Jun. 14, 2012

(30) Foreign Application Priority Data

Dec. 8, 2010    (EP) .................................... 10194167

(51) Int. Cl.
*H02M 5/458*    (2006.01)
*H02M 5/42*    (2006.01)
*H05K 7/14*    (2006.01)
*H02M 7/00*    (2006.01)

(52) U.S. Cl.
CPC ............... *H02M 5/42* (2013.01); *H05K 7/1432* (2013.01); *H02M 7/003* (2013.01)

(58) Field of Classification Search
CPC ....... H02M 5/00; H02M 5/40; H02M 5/4585; H02M 1/32; Y02E 10/76; Y02E 10/763
USPC .................. 363/34, 35, 37, 51, 52, 55, 56.02, 363/56.05; 290/44
See application file for complete search history.

(56) References Cited

U.S. PATENT DOCUMENTS

| 4,992,925 | A | * | 2/1991 | Meyer ........................... 363/141 |
| 5,132,896 | A | * | 7/1992 | Nishizawa et al. ........... 363/144 |
| 5,184,291 | A | * | 2/1993 | Crowe et al. .................... 363/37 |
| 5,313,150 | A | * | 5/1994 | Arakawa et al. .............. 318/768 |
| 5,497,289 | A | * | 3/1996 | Sugishima et al. ........... 361/709 |
| 5,559,685 | A | * | 9/1996 | Lauw et al. ...................... 363/37 |
| 5,598,328 | A | * | 1/1997 | Dore ............................. 363/141 |
| 5,623,191 | A | * | 4/1997 | Wieloch ........................ 318/801 |
| 5,953,224 | A | * | 9/1999 | Gold et al. ....................... 363/98 |

(Continued)

FOREIGN PATENT DOCUMENTS

| CN | 101091305 A | 12/2007 |
| CN | 101772882 A | 7/2010 |

(Continued)

OTHER PUBLICATIONS

Peter Arnold: "For High-Frequency Applications: SIMOVERT P Converter 6SE47", Siemens Energy & Automation, vol. 9, no. Suppl. 03, pp. 17-19, XP000065747.

*Primary Examiner* — Gary L Laxton

(57) ABSTRACT

An AC-to-AC-converter for converting a first frequency AC-voltage to a second frequency AC-voltage is disclosed. The converter includes: a first converter section which includes a first input terminal, a second input terminal, a first DC-output node, and a second DC-output node; a second converter section which includes a first DC-input node connected to the first DC-output node, a second DC-input node connected to the second DC-output node, and at least two second output terminals; a DC-link overvoltage clamp which is coupled between the first DC-output node and the second DC-output node; and a capacitor system. The first converter section, the second converter section, the DC-link overvoltage clamp, and the capacitor system are integrated into one assembly.

15 Claims, 3 Drawing Sheets

(56) References Cited

U.S. PATENT DOCUMENTS

| | | | |
|---|---|---|---|
| 6,198,642 B1* | 3/2001 | Kociecki | 363/37 |
| 7,477,530 B2* | 1/2009 | Tashima et al. | 363/34 |
| 7,518,890 B2* | 4/2009 | Hirota et al. | 363/34 |
| 7,535,737 B2* | 5/2009 | Mechi | 363/37 |
| 7,573,732 B2* | 8/2009 | Teichmann et al. | 363/51 |
| 8,179,701 B2* | 5/2012 | Swamy et al. | 363/37 |
| 8,264,859 B2* | 9/2012 | Sakakibara | 363/35 |
| 2003/0133319 A1* | 7/2003 | Radosevich et al. | 363/141 |
| 2005/0099829 A1* | 5/2005 | Wei et al. | 363/34 |
| 2007/0177314 A1 | 8/2007 | D'Atre | |
| 2008/0291708 A1 | 11/2008 | Renchang | |
| 2012/0147634 A1* | 6/2012 | Jones | 363/37 |

FOREIGN PATENT DOCUMENTS

| | | |
|---|---|---|
| DE | 20200484 U1 | 6/2002 |
| DE | 10236525 A1 | 2/2004 |
| DE | 10335575 A1 | 3/2005 |
| DE | 10351844 A1 | 6/2005 |
| DE | 102006057796 A1 | 6/2007 |
| EP | 1921738 A2 | 5/2008 |
| EP | 2043254 A2 | 4/2009 |
| EP | 2463996 A1 | 6/2012 |
| WO | WO 9615577 A1 | 5/1996 |
| WO | WO 2006069569 A1 | 7/2006 |
| WO | WO 2010094117 A1 | 8/2010 |

* cited by examiner

AC-TO-AC CONVERTER AND METHOD FOR CONVERTING A FIRST FREQUENCY AC-VOLTAGE TO A SECOND FREQUENCY AC-VOLTAGE

CROSS REFERENCE TO RELATED APPLICATIONS

This application claims priority of European Patent Office application No. 10194167.2 EP filed Dec. 8, 2010, which is incorporated by reference herein in its entirety.

FIELD OF THE INVENTION

The present invention relates to an AC-to-AC converter and to a method for converting a first frequency (in particular variable frequency) AC-voltage (or current or power) to a second frequency (in particular at least approximately fixed frequency) AC-voltage, wherein the converter may in particular be utilized in a wind turbine.

ART BACKGROUND

A conventional AC-to-AC power converter (also referred to simply as power converter or converter) may be used to adapt a frequency of an electrical power signal to a frequency of a utility grid in order to allow consumers to use the electric AC signal to drive the consumer devices requiring a fixed frequency.

Traditionally, the requirement for a full scale converters and partial converters (DFIG) for a wind turbine has been addressed by connecting together two separate 3 phase inverter modules with further separate modules as necessary for any dynamic braking duty to form an overall power converter with the appropriate ratings. There are many commercial examples of this:

Converteam MV3000 DELTA Module system which allows up to 12 modules to be associated into 1 complete power converter scheme, up to 6 paralleled for generator (or motor) inverter function and up to 6 paralleled for network inverter function. ABB ACS800 Modular power converter system also provides this type of structure.

Typically, such products when applied to systems with power ratings above the rating of 1 module achieve the higher rating by connecting multiple modules together into a parallel array. It is also known that higher power rated systems can be realized by breaking down the overall power processing into a number of separate channels such that higher levels of availability can be achieved in the event of a failure in 1 inverter module, albeit with a reduction in maximum power throughput capability in the partial operating mode. By connecting up separate 3 phase inverter modules in this manner, the dc current has to be carried from one inverter module to another. For a full scale converter the nominal dc current is the result of dividing the turbine rated power by the rated or nominal operational dc link voltage.

In former times, Converteam offered an integrated inverter package 'Alspa GD4000' which comprised machine (generator or motor) 3 phase inverter and 3 phase network inverter into 1 package up to a rating of 160 A. These integrated inverter packages were not configured for parallel configuration or sold for such parallel arrangements. Converteam also offered a liquid cooled product integrating 3 separate 3 phase inverter sections into 1 liquid cooled module. This used 1 coolant system (equivalent to 1 heatsink) and 1 dc link laminate.

There may be a need for a power converter which is simplified in its construction and which is more cost-effective. There may be a need for a structure for a power converter module aimed specifically at the requirements for a wind turbine application: A 4Q AC to AC power converter where the intermediate 'dc' interface is not a prime port to which interface is required by anything else other than the two inverter sections forming the overall function. In a full scale converter system for a wind turbine, the overall power converter is essentially a frequency changer, receiving variable frequency variable voltage from the generator and applying this to the ac phase terminals of a first inverter stage (operating generally in (active) rectification mode), the dc port (output) of which is connected to the dc port (input) of a second inverter stage (operating generally in an inverting mode) whose ac phase (output) terminals are connected via filtering components as necessary to produce nominally fixed frequency and fixed voltage output to match to a utility grid. For typical generators used in wind turbine applications (for example, permanent magnet direct drive generators) when power throughput has to be curtailed due to loss of network (grid fault for example) then means must be included in the power converter to allow connection to be maintained to provide secondary services such as reactive power support. As a result, means must be included to limit the overvoltage of the dc link capacitor and so stay below the overvoltage trip threshold of the protection circuits. A known circuit that can provide this function is a dynamic brake unit. In conventional drives this is dimensioned to cope with the energy stored in the mechanics of the system, however in this application the dimensioning is determined by that necessary to cope with the energy released from the generator during the time that power is being reduced from prevailing power to zero. This is why we describe this as a 'dc link overvoltage clamp' rather than a dynamic brake. From a circuit perspective, both are equivalent, it is only the dimensioning of the associated power components and particularly the energy dissipating resistor element that is different.

The purpose of the invention may be to minimize or eliminate wherever possible material content, components and component over-rating all with the purpose of reducing the cost of the resultant power converter module or power converter system.

SUMMARY OF THE INVENTION

This need may be met by the subject matter according to the independent claims. Advantageous embodiments of the present invention are described by the dependent claims.

According to an embodiment a AC-to-AC-converter for converting a first frequency AC-voltage to a second frequency AC-voltage is provided, wherein the converter comprises a first converter section, a second converter section; a DC-link overvoltage clamp; and a capacitor system, wherein the first converter section, the second converter section, the DC-link overvoltage clamp, and the capacitor system are integrated into one assembly.

The assembly may be a single unit, wherein the first converter section, the second converter section, the DC-link overvoltage clamp and the capacitor system are arranged adjacent to each other or beside each other to be close together without requiring any excessive or lengthy cabling or busbar system for connecting the different components together. In particular, the first converter section, the second converter section, the DC-link overvoltage clamp and the capacitor system may be powered by a single power supply, the heat of these components may be dissipated by single heat conducting heat dissipater and these components may be enclosed in a single casing or housing, to reduce the overall cost of the power converter.

The first converter section has at least a first input terminal and a second input terminal (or may comprise in total 3, 4, 5, 6 or 7 or even more terminals (the number of terminals in particular corresponding to the number of phases) and has a first DC-output node and a second DC-output node, wherein the first converter section is adapted for converting the first frequency (in particular variable frequency) AC-voltage (or current or power) applied between the first input terminal and the second input terminal (in particular phase-shifted relative to each other) to a DC-voltage (being at least approximately a direct current voltage but which may comprise voltage oscillations, such as ripple currents or ripple voltages) between the first DC-output node and the second DC-output node.

Consequently, both inverter stages are together with the dynamic brake or dc link overvoltage clamp function and are integrated into one assembly, so minimising or eliminating non-prime interfaces.

In particular, the first converter section may comprise one or more electronic components, such as transistor, in particular isolated gate bipolar transistors (IGBTs).

The second converter section has a first DC-input node connected to the first DC-output node and has a second DC-input node connected to the second DC-output node (such that the first converter section is connected to the second converter section) and has at least two second output terminals (or 3, or 4, or 5, or 6, or 7 or even more output terminals corresponding to the number of phases), wherein the second converter section is adapted for converting the DC-voltage between the first DC-input node and the second DC-input node to the second frequency (in particular at least approximately fixed frequency, such as having a frequency of 50 Hz or 60 Hz) AC-voltage between the at least two second output terminals. The at least two second output terminals may be connected to a utility grid for supplying the electric energy to consumers and their electric consumer devices and may be connected via filtering components which may then be connected to the utility grid.

The DC-link overvoltage clamp is coupled between the first DC-output node and the second DC-output node and controls the DC voltage between the first DC-output node and the second DC-output node (this voltage is also simply referred to as DC voltage) to stay within predetermined voltage limits, thus in particular preventing an overvoltage of the DC voltage. In particular, the DC-link overvoltage clamp may comprise electronic components, such as at least one transistor, such as an IGBT, and a dissipating resistor for dissipating the energy associated with an overvoltage.

The capacitor system is coupled between the first DC-output node and the second DC-output node such as to function as a temporary energy storage and also to function as a rectifier. In particular, the capacitor system may comprise one or more capacitors, wherein one or more capacitors are connected in series between the first DC-output node and the second DC-output node and wherein in particular several of serially connected capacitor sets may be connected in parallel.

The integration of the power converter into a single assembly may reduce the costs of the power converter and may also improve the ripple current cancellation between the DC-link current harmonics of the generator inverter and those of the network inverter compared to conventional schemes. Further, only one DC-link voltage feedback channel per power converter channel may be required compared to two required for a conventional converter.

The essence of this embodiment may be to integrate all power semi-conductor devices relating to one power converter 'channel' on to one heatsink. For various generator types including permanent magnet generators, the generator characteristics combined with the operational requirements for the turbine to meet the grid codes means that dynamic braking or equivalent over-voltage clamping system may be included.

By the arrangement described in this embodiment, the dc power produced from the dc port (output) of the first inverter stage (or section) may flow directly to the dc port (input) of the second inverter stage or the dc input port to the dynamic brake function without leaving the module (or assembly). For an example of a two level three phase voltage source inverter configuration, a total of 7 half-bridges may required: 3 half-bridges comprising the first 3 phase inverter stage converting variable voltage variable frequency from a generator to dc; 1 half-bridge (possibly sub-equipped to include only the upper switch with lower freewheel diode, or vice versa) for the dynamic brake or dc link overvoltage clamp function; 3 half-bridges comprising the second 3 phase inverter stage converting dc to nominally fixed voltage fixed frequency and fixed voltage output to match to a utility grid via appropriate filters.

Other economies arise from this integration step: The reduction in the component count for example: only 1 heatsink for the integrated assembly, reduction in the number of coolant ports (applicable to systems with liquid cooling which is typical for the power ratings employed in wind turbines); all power semi-conductor devices of a given power converter channel interconnected by 1 dc link laminate system; dc link voltage feedback arrangement needed for control and protection of generator and network inverter sections carried out by one functional element; other electrical component rating benefits including: Improved cancellation in dc link ripple current harmonics between the generator and network inverter sections with a corresponding reduction in harmonic ripple current rating for dc link capacitor components.

To allow the resulting power converter module to be used in power converter systems with power ratings above the rating of one power converter module, provision can be included in the design to allow for a small level of dc current to flow between paralleled power converter modules. This then may allow the dc link voltage of the resulting power converter arrangement to be controlled as one entity with the corresponding simplification of the controller structure and to allow small levels of dc current to flow between the dc link of the separate modules to carry any imbalance current that results from small differences in the phase current and or phase voltage between any of the power converter modules. This dc interface would typically be rated at ⅕₀th of the current rating of the traditional arrangement. Fuses to the generator (G1-G3) and network (N1-N3) may be optional.

According to an embodiment the power converter further comprises a heat dissipater (being in particular made of a heat conducting material, such as metal, being in particular integrally formed) having a heat supply surface (to which heat may be applied by contacting the heat supply surface with a surface of a component to be cooled) and a heat dissipation surface (which is in thermal contact with the heat supply surface, in particular via the integrally formed material comprised in the heat dissipater) for dissipating heat supplied to the heat supply surface, wherein the first converter section comprises at least one first power transistor (a transistor being capable of controlling a high power signal, such as an IGBT) in thermal contact with the heat supply surface (such that the power transistor may transfer at least a portion of heat generated when the power transistor is operated to the heat supply surface), wherein the second converter section comprises at least one second power transistor in thermal contact with the heat supply surface, and wherein the DC-link overvoltage clamp comprises a third power transistor in thermal contact with the heat supply surface. Thus, the power transistors comprised in the first converter section, the second converter section and in the DC-link overvoltage clamp are all thermally coupled to the same heat dissipater (being in particular integrally formed). Thereby, heat generated within the power transistors during operation may be effectively carried away by the single heat dissipater (and accompanying equipment, such as a coolant system).

According to an embodiment the heat dissipater is integrally formed (in particular made from a conducting material, such as a metal, for example aluminum). Thereby, the heat dissipater may be constructed in a very compact manner having a smaller dimension than in the case where each of the first converter section, the second converter section and the DC-link overvoltage clamp would have a separate heat dissipater.

According to an embodiment the heat dissipater comprises a coolant liquid inlet (in particular for a water glycol mixture as a coolant liquid) for supplying cooling liquid to be in thermal contact with the dissipation surface (such that the coolant liquid may absorb heat comprised in the heat dissipater which is transferred to the dissipation surface) and a coolant liquid outlet for discharging coolant liquid carrying heat received from the dissipation surface. Thereby, an effective cooling function for cooling the power transistors in the power converter may be achieved. In particular, no further cooling liquid inlet and no further cooling liquid outlet may be required, thereby simplifying the construction of the power converter.

According to an embodiment the DC-link overvoltage clamp further comprises a diode and a resistor, wherein the third power transistor (in particular an IGBT) comprises a first terminal (such as a collector or source terminal) connected to the first DC-output node, and a second terminal (such as a emitter or a drain terminal) connected to a mid point to which a first diode terminal and a first resistor terminal are connected are connected, wherein a second diode terminal and a second resistor terminal are connected to the second DC-output node.

Thereby, depending on a state of the third power transistor (conducting or non-conducting) an overvoltage between the first DC-output node and the second DC-output node may be discharged via the conducting third power transistor and the resistor, thereby dissipating the energy associated with the overvoltage using the resistor, thereby generating heat. Thereby, an effective overvoltage protection is provided by the DC-link overvoltage clamp. Thus, electronic components within other portions of the power converter, such as the power transistor may be protected from an overvoltage.

According to an embodiment the third power transistor (comprised in the DC-link overvoltage clamp) comprises a control terminal, wherein a conducting state between the first terminal of the third power transistor and the second terminal of the third power transistor depends on a signal applied to the third control terminal of the power transistor, wherein the converter further comprises a clamp control circuit having an output terminal connected to the control terminal of the third power transistor, wherein a signal generated at the output terminal of the clamp control circuit is based (at least) on a voltage between the first DC-output node and the second DC-output node.

In particular, the clamp control circuit may generate a signal at the output terminal to switch the third power transistor into a conducting state, when the voltage between the first DC-output node and the second DC-output node is above a threshold voltage, in order to protect the first power transistor and/or the second power transistor and/or the third transistor from an overvoltage.

According to an embodiment the power converter further comprises a first gate driver circuit for controlling a gate of the first power transistor; a second gate driver circuit for controlling a gate of the second power transistor; (the third transistor has as a gate driver the clamp control circuit) and a power supply for supplying the first gate driver circuit, the second gate driver circuit and the clamp control circuit with electric energy. In particular, the power supply may be the sole power supply for operating the power converter. Thereby, a size and a dimension of the power converter and also a cost of the power converter may be reduced compared to a conventional power converter.

According to an embodiment the capacitor system comprises at least one set of serially connected capacitors connected between the first DC-output node and the second DC-output node. Thus, a single capacitor comprised in the capacitor system may be rated at a lower voltage than the voltage usually applied between the first DC-output node and the second DC-output node. In particular, the capacitor system may comprise 21 capacitors (wherein seven sets of capacitor chains each comprising three serially connected capacitors) may be connected in parallel between the first DC-output node and the second DC-output node. Thereby, conventionally available capacitors may be used for the power converter in order to reduce the costs of the power converter. It would also be feasible to have one single metalised polypropyelene capacitor carrying out the dc link capacitor function.

According to an embodiment the power converter further comprises a DC-link-laminate system (comprising conductors and insulating members) comprising a first metal surface connected to the first DC-output node and a second metal surface connected to the second DC-output node. The DC-link-laminate system may provide a compact means for enabling the required connectivities between the different components of the power converter.

According to an embodiment the power converter further comprises a casing (or housing or enclosure) for enclosing at least the first converter section, the second converter section, the DC-link overvoltage clamp, and the capacitor system, and in particular also enclosing the heat dissipater, the coolant liquid inlet, the coolant liquid outlet, the clamp control circuit, the first gate driver circuit, the second gate driver circuit and the power supply. Thereby, a compact assembly may be achieved.

According to an embodiment the DC-link overvoltage clamp is arranged adjacent to the first converter section or adjacent to the second converter section. In particular, no space or no clearance (implicitly there must be clearance, but only to ensure the necessary electrical isolation distances between the functional elements) is provided between the DC-link overvoltage clamp and one of the first or the second coupling section, in order to achieve a compact assembly.

According to an embodiment a base area of the assembly amounts to less than 5 times, in particular 3 times, a base area of a power transistor times a number of power transistors comprised in the assembly. The design may have a base area determined by the base area of seven power transistor modules plus the inter-power-transistor-module clearances required for functional insulation between the power transistor modules. This all may depend on the specific rating of the equipment and the characteristics of the power transistor modules. It would be feasible at some ratings to use a '6 pack' IGBT module for the generator bridge, another '6 pack' IGBT module for the Network bridge and a single half-bridge for the overvoltage clamp. A '6 pack' comprises three half-bridges in one assembly. It may also be possible to purchase seven packs comprising the three half bridges for an inverter section (generator or network) and a further sub-equipped half bridge for the overvoltage clamp (usually known as the DB (dynamic brake)) function.

According to an embodiment a wind turbine is provided which comprises an electric generator having at least a first output terminal and a second output terminal (or 3, 4, 5, 6, 7, or even more output terminals) for outputting a variable frequency power signal; a rotor for driving the electric generator (the rotor in particular comprising one or more rotor blades which are driven by wind); and an AC-to-AC-converter according to an embodiment as described above, wherein the first input terminal of the first converter section is connected to the first output terminal of the generator and wherein the second input terminal of the first converter section is connected to the second output terminal of the generator. In particular, the at least two second output terminals of the second converter section may be connected to an utility grid for providing electric energy to consumer devices. Depending on the application and rating of the wind turbine and rating of the power converter one or more converter modules may be provided for a single wind turbine. These may for example be connected in parallel or in series.

It should be understood that features (individual or in any combination) disclosed, described, explained or mentioned with respect to embodiments of an AC-to-AC-converter for converting a first frequency AC-voltage to a second frequency AC-voltage or to a wind turbine may also be applied, used for or employed in a method for converting a first frequency AC-voltage to a second frequency AC-voltage.

According to an embodiment a method for converting a first frequency AC-voltage to a second frequency AC-voltage is provided, wherein the method comprises converting the first frequency AC-voltage applied between a first input terminal of a first converter section and a second input terminal of the first converter section to a DC-voltage between a first DC-output node and a second DC-output node; converting the DC-voltage between a first DC-input node of a second converter section and a second DC-input node of the second converter section to a second frequency AC-voltage between at least two second output terminals of the second converter section; clamping the DC-voltage to be below a threshold voltage by using a DC-link overvoltage clamp coupled between the first DC-output node and the second DC-output node; and rectifying the DC-voltage by using a capacitor system coupled between the first DC-output node and the second DC-output node, wherein the first converter section, the second converter section, the DC-link overvoltage clamp, and the capacitor system are integrated into one assembly.

In all the above, the direction of power flow could be reversed, so that power is taken from the supply network and fed to a drive machine (motor). In such an arrangement, the circuit may remain identical, but input and output statements may be reversed.

It has to be noted that embodiments of the invention have been described with reference to different subject matters. In particular, some embodiments have been described with reference to method type claims whereas other embodiments have been described with reference to apparatus type claims. However, a person skilled in the art will gather from the above and the following description that, unless otherwise notified, in addition to any combination of features belonging to one type of subject matter also any combination between features relating to different subject matters, in particular between features of the method type claims and features of the apparatus type claims is considered as to be disclosed with this document.

Beside other the following advantages may be achieved by embodiments: Integration of power converter 'channel' on to 1 heatsink—reduction in cost, although heatsink is larger, only 1 machining operation, 1 logistics cost, 1 set-up cost, etc; Reduction in number of coolant ports, 1× inlet and 1× outlet for the integrated power converter channel on to one heatsink compared to 2× inlet and 2× outlet for conventional arrangement built from separate 3 phase to dc inverter sections each with separate heatsinks; All dc link interconnections contained in 1 dc link laminate system—reduction in cost by reduction in number of parts, although dc link laminate system is larger, 1 logistics cost, 1 set-up cost, etc.; Improved ripple current cancellation between the dc link current harmonics of the generator inverter and those of the network inverter compared to the conventional schemes; 1 dc link voltage feedback channel per power converter channel compared to 2 for conventional scheme; 1 auxiliary switched mode or equivalent power supply function for all 7 half-bridges of the integrated arrangement compared to two separate auxiliary switched mode or equivalent power supply functions for the conventional scheme; Fault protection for the dc interconnection between multiple power converter channels is now carried out with low current rated fuses compared to the larger rated components required in the conventional scheme.

Reduced dimensioning in the size and current rating of the overall high current switched dc circuit makes electro-magnetic compatibility easier to achieve—effectively smaller broadcasting antenna to other nearby equipment.

In summary, the current rating for a given power converter channel is generally determined by the rating possible with the largest power semi-conductor devices available at a given time (or internally paralleled configurations of such power semi-conductor devices operating together). For higher power rated systems, such as those required for a modern wind turbine, multiple power converter channels have to be employed to achieve the power rating. The purpose of embodiments described here may be to bring together all those functional elements relating to a given power converter channel into one assembly and so minimise the number and rating of interfaces and minimise the number of piece parts necessary—heatsink, dc link interconnecting laminate, enclosure, auxiliary circuits, fixings, etc.

Embodiments of the present invention are now described with reference to the accompanying drawings.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DETAILED DESCRIPTION

Figure 1:
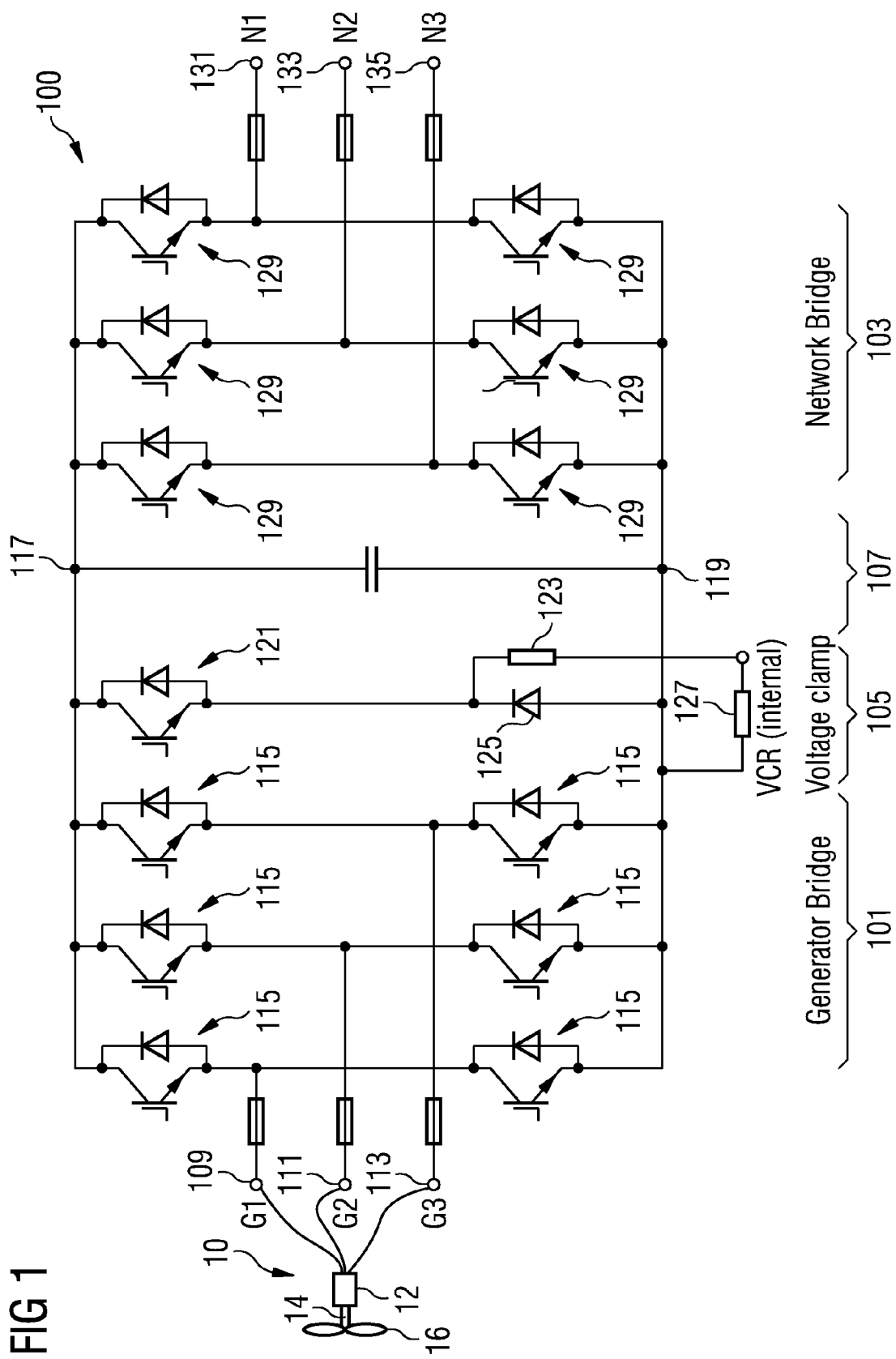
FIG. 1 schematically illustrates a circuit diagram of an AC-to-AC-converter (power converter) according to an embodiment.

The illustration in the drawing is in schematical form. It is noted that in different figures, similar or identical elements are provided with the same reference signs or with reference signs, which are different from the corresponding reference signs only within the first digit.

The AC-to-AC-converter 100 (also referred to as power converter) illustrated in FIG. 1 comprises a first converter section 101, a second converter section 103, a DC-link overvoltage clamp 105, and a capacitor system 107. As inputs to the power converter 100 the first converter section has a first input terminal 109 (also referred to as G1), a second input terminal 111 (also referred to as G2) and a third input terminal 113 (also referred to as G3). The terminals G1, G2 and G3 may for example be connected to output terminals of an electric generator 12 of a wind turbine 10 which provides variable frequency AC-signals to the power converter 100. Wind turbine 10 includes a rotor 14 for driving electric generator 12, and the rotor includes one or more rotor blades 16 which are driven by wind.

The first converter section further comprises three pairs of IGBTs 115, wherein each of the three pairs is connected to a first DC-output node 117 and to a second DC-output node 119. The three pairs of IGBTs 115 comprised in the first converter section 101 convert the variable frequency AC-voltage applied to the terminals G1, G2 and G3 to a substantially direct current voltage between the first DC-output node 117 and the second DC-output node 119.

In order to prevent an overvoltage between the first DC-output node 117 and the second DC-output node 119 (for example due to a shutdown of a direct drive generator) the DC-link overvoltage clamp 105 (also simply referred to as voltage clamp) is provided. The voltage clamp 105 comprises an IGBT 121 which is controlled (by connection to its gate terminal) by a not illustrated clamp control circuit. The IGBT 121 is connected in series with a fuse 123 which is optional and not mandatory. Parallel to the fuse a diode 125 is arranged. In series with the fuse 123 an internal voltage clamp resistor 127 is arranged.

In case an overvoltage should occur between the first DC-output node 117 and the second DC-output node 119 the IGBT 121 of the voltage clamp 105 may be switched to a conducting state such that the overvoltage may be reduced and the energy dissipated via current flow through the fuse 123 (and in particular also through the resistor 127).

The capacitor system 107 (which may in particular comprise 21 single capacitors) is provided for temporarily storing energy and/or at least approximately rectifying the DC voltage.

The second converter section 103 (also referred to as network bridge) comprises three pairs of IGBTs 129, wherein the three pairs are connected in parallel between the first DC-output node 117 and the second DC-output node 119. Thereby, the IGBTs 129 are connected and controlled (by not illustrated gate driver circuits) such that the DC voltage between the first DC-output node 117 and the second DC-output node 119 is converted to a fixed frequency AC-voltage applied to the second output terminals 131 (also referred to as N1), 133 (also referred to as N2), and 135 (also referred to as N3). For this kind of conversion the IGBTs 129 are controlled by not illustrated gate driver circuits connected to the corresponding gates. An output terminal 124 of a damp control circuit 122 is connected to a control terminal 126 of the third power transistor 121 and a signal 128 generated at the output terminal 124 of the clamp control circuit 122 is based on a voltage between the first DC-output node 117 and the second DC-output node 119. The converter 100 further comprises a first gate driver circuit 116 for controlling a gate 118 of the first power transistor 115; a second gate driver circuit 130 for controlling a gate 132 of the second power transistor 129 and a power supply 140 for supplying the first gate driver circuit 116, the second gate driver circuit 130 and the clamp control circuit 122 with electric energy. The converter 100 comprises a capacitor system 155 which comprises at least one set of serially connected capacitors (for example the capacitors 255 illustrated in FIG. 3) connected between the first DC-output node 117 and the second DC-output node 119.

Figure 2:
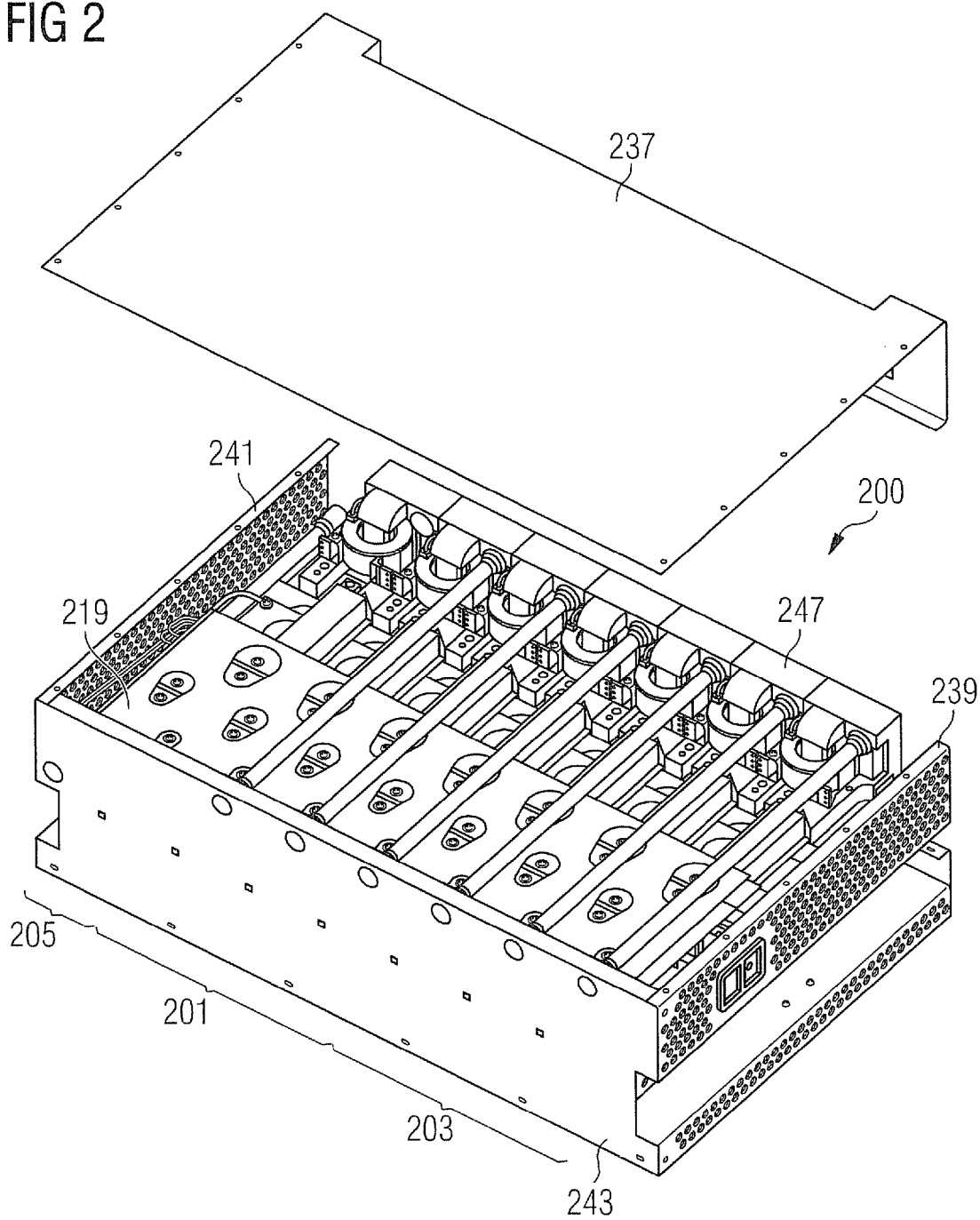
FIG. 2 illustrates the AC-to-AC schematically illustrated in FIG. 1 integrated in a single assembly.
Figure 3:
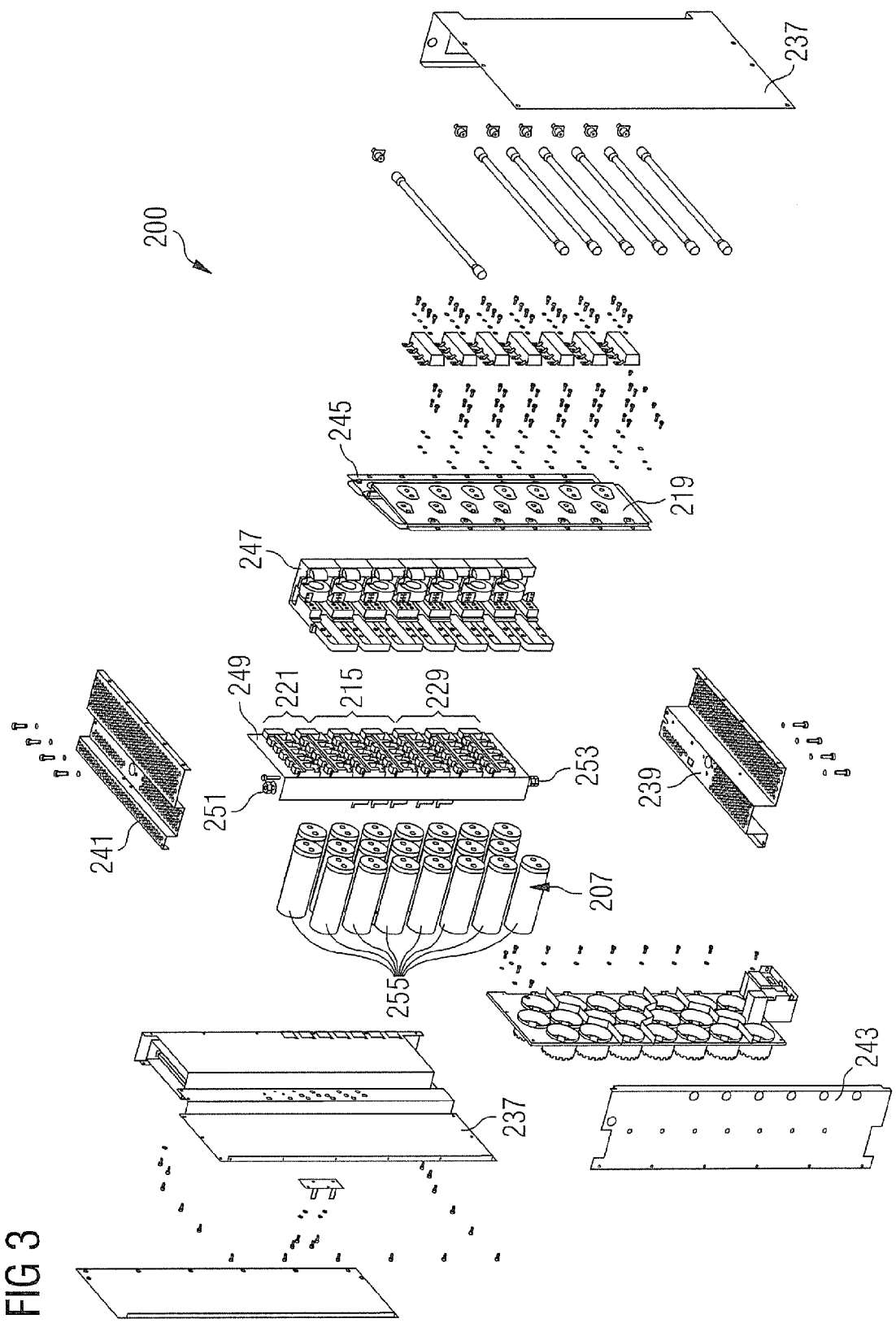
FIG. 3 illustrates the assembly of the AC-to-AC converter illustrated in FIG. 2 in an exploded view.

FIG. 2 illustrates the power converter 100 illustrated schematically in FIG. 1 integrated into a single assembly 200 according to an embodiment. An exploded view of the assembly 200 is illustrated in FIG. 3. As can be seen from FIG. 2 being a three-dimensional illustration the first converter section (also referred to as generator bridge) 201 is arranged beside and immediately adjacent to the second converter section 203 (also referred to as network bridge). Adjacent to the first converter section 201 the voltage clamp 205 is arranged. All components of the power converter are enclosed within a casing having casing faces or walls 237, 239, 241, 243. The second DC-output node 119 is here implemented as a copper metal layer 219 which is comprised in the so-called DC-link-laminate 245. The DC-link-laminate 245, as is illustrated in further detail in FIG. 3, enables electrical connectivity between different components of the power converter 200.

Further, the power converter comprises an assembly 247 of the gate drivers and current sensors relating to each IGBT half bridge module which is shown mounted to the heat dissipators which comprise gate driver circuits for driving the IGBTs comprised in the first converter section 201 and also comprised in the second converter section 203. Further, the assembly 247 comprises current sensors for measuring currents and providing the measured current values to the gate driver circuits. Further, referring to FIG. 3, the power converter 200 comprises a heat dissipater 249 (being made of a heat conducting material) to which the IGBTs of the first converter section, the second converter section and the DC-link overvoltage clamp are screwed and thus thermally connected or in contact.

Further, the heat dissipater comprises a coolant liquid outlet 251 and a coolant liquid inlet 253. Via the coolant liquid outlet 251 cooling liquid may be supplied to an interior of the heat dissipater 249 to absorb and then carry away heat generated by half bridge IGBT module 221 associated with the voltage clamp function, half bridge IGBT module 215 associated with the generator bridge function, and half bridge IGBT module 229 associated with the network bridge function and transferred to the heat dissipater 249. Other physical arrangements for the half bridge IGBT modules 221, 215, 229 are possible, for example G1, N1, G2, N2, G3, N3, VC from top to bottom, or G1, G2, G3, VC, N1, N2 N3, etc. in any possible permutation.

Further, the power converter 200 comprises as the capacitor system 207 a number of 21 capacitors 255 which are illustrated as cylinders, which are arranged parallel to each other. The power converter 200 further comprises a power supply to supply the gate driver circuits with electrical energy.

The physical construction of the power converter of FIGS. 2 and 3 comprises 7 half-bridge modules for G1-G3, N1-N3 and the voltage clamp function. The minimally rated dc interface is shown at the bottom right of the mechanical schematic of FIG. 2. The Assembly 200 of FIG. 2 comprises from left to right: DC Link Overvoltage clamp half bridge section; G1 to G3; N1 to N3

Other arrangements are also feasible including: DC Link overvoltage clamp; G1; N1; G2, N2; G3; N3; or G1; N1; G2; DC Link overvoltage clamp; N2; G3; N3; or any other arrangements or combinations.

The arrangement of the integration of generator and network inverters with the dynamic brake or dc link over-voltage clamp function into 1 power converter channel may be applicable to any 4 quadrant power conversion arrangement and could be applied to other power generation schemes or power conversion schemes with power flow in either direction through the power converter, e.g. generator inverter to network inverter for a power generator scheme or network inverter now acting as the rectifier to the generator inverter now operating in the inversion mode driving a motor or similar load. The arrangement can also be applied to other standard and well known inverter topologies such as 3 level neutral point clamp schemes and flying capacitor (Foch-Meynard) schemes.

It should be noted that the term "comprising" does not exclude other elements or steps and "a" or "an" does not exclude a plurality. Also elements described in association with different embodiments may be combined. It should also be noted that reference signs in the claims should not be construed as limiting the scope of the claims.

The invention claimed is:

1. A wind turbine comprising:
an electric generator having at least a first output terminal and a second output terminal for outputting a variable frequency power signal;
a rotor for driving the electric generator;
an AC-to-AC-converter for converting a first frequency AC-voltage to a second frequency AC-voltage, the converter comprising:
a first converter section including at least a first input terminal and a second input terminal and including a first DC-output node and a second DC-output node, the first converter section being adapted for converting the first frequency AC-voltage applied between the first input terminal and the second input terminal to a DC-voltage between the first DC-output node and the second DC-output node;
a second converter section including a first DC-input node connected to the first DC-output node and including a second DC-input node connected to the second DC-output node and including at least two second output terminals, the second converter section being adapted for converting the DC-voltage between the first DC-input node and the second DC-input node to the second frequency AC-voltage between the at least two second output terminals;
a DC-link overvoltage clamp coupled between the first DC-output node and the second DC-output node, the DC-link overvoltage clamp configured to clamp the DC-voltage between the first DC-output node and the second DC-output node to be below a threshold voltage;
a capacitor system coupled between the first DC-output node and the second DC-output node; and
a heat dissipater including a heat supply surface and a heat dissipation surface for dissipating heat supplied to the heat supply surface,
wherein the first input terminal of the first converter section is connected to the first output terminal of the generator and the second input terminal of the first converter section is connected to the second output terminal of the generator,
wherein the DC-link overvoltage clamp is arranged adjacent to the first converter section or to the second converter section,
wherein the first converter section comprises at least one first power transistor in thermal contact with the heat supply surface,
wherein the second converter section comprises at least one second power transistor in thermal contact with the heat supply surface,
wherein the DC-link overvoltage clamp comprises a plurality of components including a third power transistor in thermal contact with the heat supply surface,
wherein the first converter section, the second converter section, the DC-link overvoltage clamp, and the capacitor system are integrated into one assembly, wherein the plurality of components that comprises the DC-link overvoltage clamp is internally disposed in the one assembly,
wherein the heat dissipater is integrally formed, and
wherein all power transistors comprised in the first converter section, the second converter section and in the DC-link overvoltage clamp are all thermally coupled to the same heat dissipater;
the AC-to-AC-converter further comprising a DC-link-laminate system comprising a first metal surface connected to the first DC-output node and a second metal surface connected to the second DC-output node.

2. The AC-to-AC-converter according to claim 1, wherein current flow through the plurality of component that comprises the DC-link overvoltage clamp, including an internal voltage clamp resistor, occurs without exiting the one assembly.

3. The wind turbine according to claim 1, wherein the heat dissipater comprises a coolant liquid inlet for supplying cooling liquid to be in thermal contact with the dissipation surface and a coolant liquid outlet for discharging coolant liquid carrying heat received from the dissipation surface.

4. The wind turbine according to claim 1, wherein the plurality of components that comprises the DC-link overvoltage clamp further includes a diode and a fuse,
wherein the third power transistor comprises a first terminal connected to the first DC-output node, and a second terminal connected to a mid point to which a first diode terminal and a first resistor terminal are connected,
wherein a second diode terminal and a second resistor terminal are connected to the second DC-output node.

5. The wind turbine according to claim 4, wherein the third power transistor comprises a control terminal, wherein a conducting state between the first terminal of the third power transistor and the second terminal of the third power transistor depends on a signal applied to the third control terminal of the power transistor,
the converter further comprising:
a clamp control circuit including an output terminal connected to the control terminal of the third power transistor, wherein a signal generated at the output terminal of the clamp control circuit is based on a voltage between the first DC-output node and the second DC-output node.

6. The wind turbine according to claim 5, wherein the clamp control circuit is adapted to generate a signal at its output terminal such that the third power transistor is in the conducting state, if the voltage between the first DC-output node and the second DC-output node is above the threshold voltage, in order to protect the first power transistor and/or the second power transistor from an overvoltage.

7. The wind turbine according to claim 5, further comprising:
a first gate driver circuit for controlling a gate of the first power transistor;
a second gate driver circuit for controlling a gate of the second power transistor;
a power supply for supplying the first gate driver circuit, the second gate driver circuit and the clamp control circuit with electric energy.

8. The wind turbine according to claim 1, wherein the capacitor system comprises at least one set of serially connected capacitors connected between the first DC-output node and the second DC-output node.

9. The wind turbine according to claim 1, further comprising a DC-link-laminate system comprising a first metal surface connected to the first DC-output node and a second metal surface connected to the second DC-output node.

10. The wind turbine according to claim 1, further comprising a casing for enclosing at least the first converter section, the second converter section, the DC-link overvoltage clamp, and the capacitor system.

11. The wind turbine according to claim 1, wherein the DC-link overvoltage clamp is arranged adjacent to the first converter section or the second converter section.

12. The wind turbine according to claim 1, wherein a base area of the assembly amounts to less than 5 times a base area of a power transistor times a number of power transistors comprised in the assembly.

13. The wind turbine according to claim 12, wherein a base area of the assembly amounts to 3 times a base area of a power transistor times a number of power transistors comprised in the assembly.

14. A method for converting a first frequency AC-voltage to a second frequency AC-voltage, the method comprising:
converting the first frequency AC-voltage applied between a first input terminal of a first converter section and a second input terminal of the first converter section to a DC-voltage between a first DC-output node and a second DC-output node;
converting the DC-voltage between a first DC-input node of a second converter section and a second DC-input node of the second converter section to a second frequency AC-voltage between at least two second output terminals of the second converter section;
clamping the DC-voltage to be below a threshold voltage by using a DC-link overvoltage clamp coupled between the first DC-output node and the second DC-output node; and
flattening the DC-voltage by using a capacitor system coupled between the first DC-output node and the second DC-output node,
wherein the first converter section, the second converter section, the DC-link overvoltage clamp, and the capacitor system are integrated into one assembly comprising a heat dissipater including a heat supply surface and a heat dissipation surface for dissipating heat supplied to the heat supply surface,
wherein the DC-link overvoltage clamp is arranged adjacent to the first converter section or to the second converter section,
wherein the first converter section comprises at least one first power transistor in thermal contact with the heat supply surface,
wherein the second converter section comprises at least one second power transistor in thermal contact with the heat supply surface,
wherein the DC-link overvoltage clamp comprises a plurality of components including a third power transistor in thermal contact with the heat supply surface,
wherein the heat dissipater is integrally formed, and
wherein all power transistors comprised in the first converter section, the second converter section and in the DC-link overvoltage clamp are all thermally coupled to the same heat dissipater;
wherein an AC-to-AC-converter for converting a first frequency AC-voltage to a second frequency AC-voltage comprises the first converter section, the second converter section, the DC-link overvoltage clamp and the capacitor system,
the method further comprising:
arranging the AC-to-AC-converter with a DC-link-laminate system comprising a first metal surface connected to the first DC-output node and a second metal surface connected to the second DC-output node; and
internally disposing the plurality of components that comprises the DC-link overvoltage clamp in the one assembly,
wherein a wind turbine comprises:
an electric generator having at least a first output terminal and a second output terminal for outputting a variable frequency power signal; and
a rotor for driving the electric generator; and
the method further comprising:
connecting the first input terminal of the first converter section to the first output terminal of the generator and further connecting the second input terminal of the first converter section to the second output terminal of the generator.

15. The method of claim 14, wherein, the internally disposing of the plurality of components in the one assembly, allows current flow through the plurality of components that comprise the DC-link overvoltage clamp, including an internal voltage clamp resistor, without said current flow exiting the one assembly.

* * * * *